US012074175B2

(12) United States Patent
Cho et al.

(10) Patent No.: US 12,074,175 B2
(45) Date of Patent: Aug. 27, 2024

(54) DISPLAY SUBSTRATE, METHOD OF MANUFACTURING THE SAME, AND DISPLAY DEVICE INCLUDING THE SAME

(71) Applicant: SAMSUNG DISPLAY CO., LTD., Yongin-si (KR)

(72) Inventors: Sungwon Cho, Hwaseong-si (KR); Yu-Gwang Jeong, Anyang-si (KR); Daewon Choi, Cheonan-si (KR); Seon-Il Kim, Hwaseong-si (KR); Subin Bae, Hwaseong-si (KR); Yun Jong Yeo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/822,751

(22) Filed: Aug. 26, 2022

(65) Prior Publication Data

US 2022/0415932 A1    Dec. 29, 2022

Related U.S. Application Data

(62) Division of application No. 16/896,146, filed on Jun. 8, 2020, now Pat. No. 11,462,574.

(30) Foreign Application Priority Data

Oct. 11, 2019  (KR) ........................ 10-2019-0125992

(51) Int. Cl.
*H01L 27/14*   (2006.01)
*H01L 27/12*   (2006.01)
*H01L 29/786*  (2006.01)

(52) U.S. Cl.
CPC ........ *H01L 27/1255* (2013.01); *H01L 27/124* (2013.01); *H01L 27/1259* (2013.01); *H01L 29/78648* (2013.01)

(58) Field of Classification Search
CPC .............. H01L 27/1255; H01L 27/124; H01L 27/1259; H01L 29/78648; H01L 27/1248;
(Continued)

(56) References Cited

U.S. PATENT DOCUMENTS 7,888,682 B2 *  2/2011  Park .................. H01L 29/66757
                                                  257/E29.292
9,484,465 B2   11/2016  Choi et al.
(Continued)

FOREIGN PATENT DOCUMENTS

KR   10-2015-0045111    4/2015
KR   10-2015-0075512    7/2015
(Continued)

*Primary Examiner* — Tan N Tran
(74) *Attorney, Agent, or Firm* — Lewis Roca Rothgerber Christie LLP

(57) ABSTRACT

A display substrate includes a substrate, a first gate electrode on the substrate, a first gate insulating layer on the first gate electrode, an active layer on the first gate insulating layer, a second gate insulating layer on the active layer, a second gate electrode on the second gate insulating layer, an interlayer insulating layer on the second gate electrode, a first electrode on the interlayer insulating layer to contact a top surface, a side wall, and a bottom surface of the active layer via a first contact hole through the interlayer insulating layer, the second gate insulating layer, the active layer, and a portion of the first gate insulating layer, and a second electrode on the interlayer insulating layer to contact the first gate electrode via a second contact hole through the interlayer insulating layer, the second gate insulating layer, and the first gate insulating layer.

18 Claims, 13 Drawing Sheets

(58) Field of Classification Search
CPC ........... H01L 29/41733; H01L 27/1214; H01L 29/7866; H10K 59/12; H10K 59/1201; H10K 59/1213; H10K 59/1315; H10K 59/123; H10K 59/124; H10K 71/00
USPC ..................................................... 257/59, 72
See application file for complete search history.

(56) References Cited

U.S. PATENT DOCUMENTS

| | | | |
|---|---|---|---|
| 9,842,864 B2* | 12/2017 | Kim | ..................... H10K 59/126 |
| 10,411,074 B2 | 9/2019 | Won et al. | |
| 10,622,428 B2* | 4/2020 | Oh | .................... H01L 29/66765 |
| 2017/0141169 A1 | 5/2017 | Sim et al. | |

FOREIGN PATENT DOCUMENTS

| | | |
|---|---|---|
| KR | 10-2018-0024909 | 3/2018 |
| KR | 10-2018-0047579 | 5/2018 |
| KR | 10-2019-0003150 | 1/2019 |

\* cited by examiner

DISPLAY SUBSTRATE, METHOD OF MANUFACTURING THE SAME, AND DISPLAY DEVICE INCLUDING THE SAME

CROSS-REFERENCE TO RELATED APPLICATIONS

This application is a divisional of U.S. patent application Ser. No. 16/896,146, filed Jun. 8, 2020, which claims priority to and the benefit of Korean Patent Application No. 10-2019-0125992, filed Oct. 11, 2019, the entire content of both of which is incorporated herein by reference.

BACKGROUND

1. Field

One or more embodiments relate to a display substrate. More particularly, one or more embodiments relate to a display substrate, a method of manufacturing the display substrate, and a display device including the display substrate.

2. Description of the Related Art

A display device is a device configured to display an image for providing visual information to a user. The display device may include a light emitting element configured to generate light for displaying the image. The display device may also include a display substrate including a transistor configured to provide a current, a voltage, and the like for driving the light emitting element.

In a process of manufacturing the display substrate, a photo process for forming a conductive pattern or forming a contact hole in an insulating layer may be performed. Because a photo mask is used for such a photo process, and a manufacturing time and a manufacturing cost are associated with forming the photo mask, a manufacturing time and a manufacturing cost for the display substrate may be increased as the photo process is additionally performed (e.g., performed in addition to other photo processes).

SUMMARY

One or more aspects of embodiments are directed toward a display substrate in which a contact resistance between a first electrode and an active layer decreases and a display device including the display substrate.

One or more aspects of embodiments are directed toward a method of manufacturing a display substrate for forming a first contact hole and a second contact hole without additional photolithography processes.

A display substrate according to embodiments may include a substrate, a first gate electrode on the substrate, a first gate insulating layer on the substrate to cover the first gate electrode, an active layer on the first gate insulating layer, a second gate insulating layer on the first gate insulating layer to cover the active layer, a second gate electrode on the second gate insulating layer, an interlayer insulating layer on the second gate insulating layer to cover the second gate electrode, a first electrode on the interlayer insulating layer to contact a top surface, a side wall, and a bottom surface of the active layer via a first contact hole through the interlayer insulating layer, the second gate insulating layer, the active layer, and a portion of the first gate insulating layer, and a second electrode on the interlayer insulating layer to contact the first gate electrode via a second contact hole through the interlayer insulating layer, the second gate insulating layer, and the first gate insulating layer.

In one embodiment, the second electrode may contact a top surface of the first gate electrode via the second contact hole.

In one embodiment, the first contact hole may include a first portion formed through the second gate insulating layer to expose the top surface of the active layer, a second portion formed through the active layer to expose the side wall of the active layer, and a third portion formed through the portion of the first gate insulating layer to expose the bottom surface of the active layer.

In one embodiment, a width of the first portion may be greater than a width of the second portion.

In one embodiment, a width of the third portion may be greater than a width of the second portion.

In one embodiment, the first gate insulating layer may include a first sub-insulating layer on the substrate to cover the first gate electrode and a second sub-insulating layer on the first sub-insulating layer.

In one embodiment, the portion of the first gate insulating layer may include the second sub-insulating layer.

In one embodiment, the first sub-insulating layer may include silicon nitride.

In one embodiment, the second sub-insulating layer may include silicon oxide.

In one embodiment, the active layer may include polycrystalline silicon.

In one embodiment, the second gate insulating layer may include silicon oxide.

In one embodiment, the first gate electrode may overlap the second gate electrode with the active layer interposed therebetween.

In one embodiment, the interlayer insulating layer may include a first interlayer insulating layer on the second gate insulating layer to cover the second gate electrode and a second interlayer insulating layer on the first interlayer insulating layer.

In one embodiment, the first interlayer insulating layer may include silicon nitride.

In one embodiment, the display substrate may further include a capacitor electrode between the first interlayer insulating layer and the second interlayer insulating layer, and overlapping the second gate electrode.

A method of manufacturing a display substrate according to embodiments may include forming a first gate electrode on a substrate, forming a first gate insulating layer on the substrate to cover the first gate electrode, forming an active layer on the first gate insulating layer, forming a second gate insulating layer on the first gate insulating layer to cover the active layer, forming a second gate electrode on the second gate insulating layer, forming an interlayer insulating layer on the second gate insulating layer to cover the second gate electrode, forming a first contact hole through the interlayer insulating layer, the second gate insulating layer, the active layer, and a portion of the first gate insulating layer to expose a top surface, a side wall, and a bottom surface of the active layer, forming a second contact hole through the interlayer insulating layer, the second gate insulating layer, and the first gate insulating layer to expose the first gate electrode, and forming a first electrode to fill the first contact hole and a second electrode to fill the second contact hole on the interlayer insulating layer. The first contact hole and the second contact hole may be substantially concurrently (e.g., simultaneously) formed.

In one embodiment, the first contact hole and the second contact hole may be formed by a dry etching scheme using one etching gas (e.g., only one etching gas).

In one embodiment, the first contact hole and the second contact hole may be formed by the etching gas obtained by mixing a first gas including at least one of $CHF_3$, $C_4F_8$, $C_2HF_5$, $CH_2F_2$, or $CF_4$ with a second gas including at least one of $SF_6$ or $NF_3$.

In one embodiment, the first contact hole and the second contact hole may be formed by using at least two different etching materials.

In one embodiment, the forming of the first contact hole may include forming a first portion of the first contact hole which exposes the top surface of the active layer by etching the second gate insulating layer, forming a second portion of the first contact hole which exposes the side wall of the active layer by etching the active layer, and forming a third portion of the first contact hole which exposes the bottom surface of the active layer by etching the portion of the first gate insulating layer. A first etching material for forming the first portion may be different from a second etching material for forming the second portion.

In one embodiment, the first etching material may include an etching gas obtained by mixing a first gas including at least one of $CHF_3$, $C_4F_8$, $C_2HF_5$, $CH_2F_2$, or $CF_4$ with a second gas including at least one of $SF_6$ or $NF_3$, or an etchant including a buffered oxide etchant (BOE).

In one embodiment, the second etching material may include an etching gas obtained by mixing a first gas including at least one of $CHF_3$, $C_4F_8$, $C_2HF_5$, $CH_2F_2$, or $CF_4$ with a second gas including at least one of $SF_6$ or $NF_3$.

In one embodiment, a third etching material for forming the third portion may be different from the second etching material.

In one embodiment, the third etching material may be identical to the first etching material.

A display device according to embodiments may include a substrate, a first gate electrode on the substrate, a first gate insulating layer on the substrate to cover the first gate electrode, an active layer on the first gate insulating layer, a second gate insulating layer on the first gate insulating layer to cover the active layer, a second gate electrode on the second gate insulating layer, an interlayer insulating layer on the second gate insulating layer to cover the second gate electrode, a first electrode on the interlayer insulating layer to contact a top surface, a side wall, and a bottom surface of the active layer via a first contact hole through the interlayer insulating layer, the second gate insulating layer, the active layer, and a portion of the first gate insulating layer, a second electrode on the interlayer insulating layer to contact the first gate electrode via a second contact hole through the interlayer insulating layer, the second gate insulating layer, and the first gate insulating layer, a planarization layer on the interlayer insulating layer to cover the first electrode and the second electrode, a pixel electrode on the planarization layer, a counter electrode overlapping the pixel electrode, and a light emitting layer between the pixel electrode and the counter electrode.

In the display substrate and the display device according to the embodiments, the first electrode may contact the top surface, the side wall, and the bottom surface of the active layer exposed by the first contact hole through the first contact hole passing through the active layer, so that the contact resistance between the first electrode and the active layer may decreases In the method of manufacturing the display substrate according to the embodiments, the first contact hole exposing the top surface, the side wall, and the bottom surface of the active layer by passing through the active layer and the second contact hole exposing the first gate electrode may be substantially concurrently (e.g., substantially simultaneously) formed, so that the first contact hole and the second contact hole may be formed without additional photolithography processes.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Hereinafter, display substrates, methods of manufacturing display substrates, and display devices in accordance with embodiments will be explained in more detail with reference to the accompanying drawings.

Hereinafter, a display substrate according to one or more embodiments of the present disclosure will be described with reference to FIGS. 1 and 2.

Figure 1:
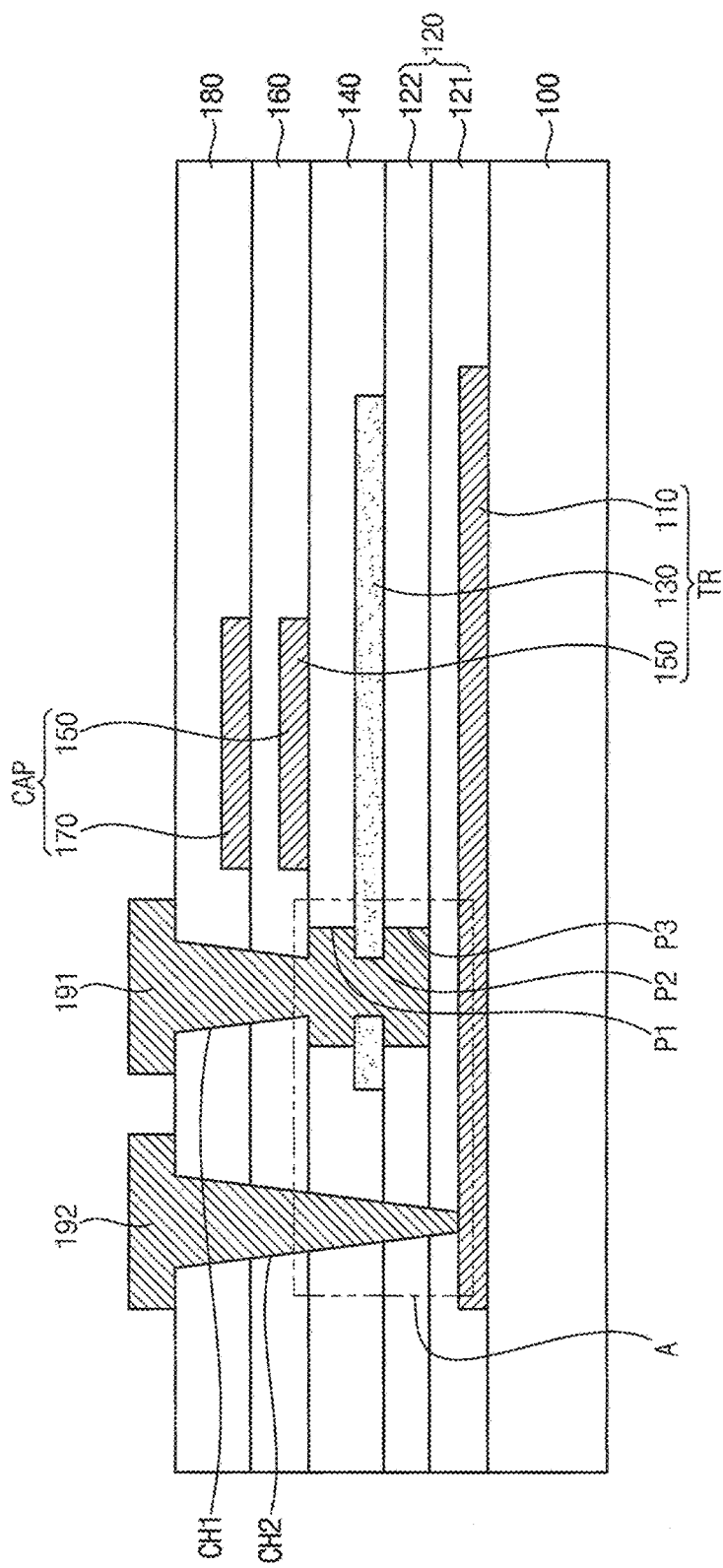
FIG. 1 is a cross-sectional view showing a display substrate according to one or more embodiments of the present disclosure.

FIG. 1 is a cross-sectional view showing a display substrate according to one or more embodiments of the present disclosure. FIG. 2 is a cross-sectional view showing the region A of FIG. 1.

Figure 2:
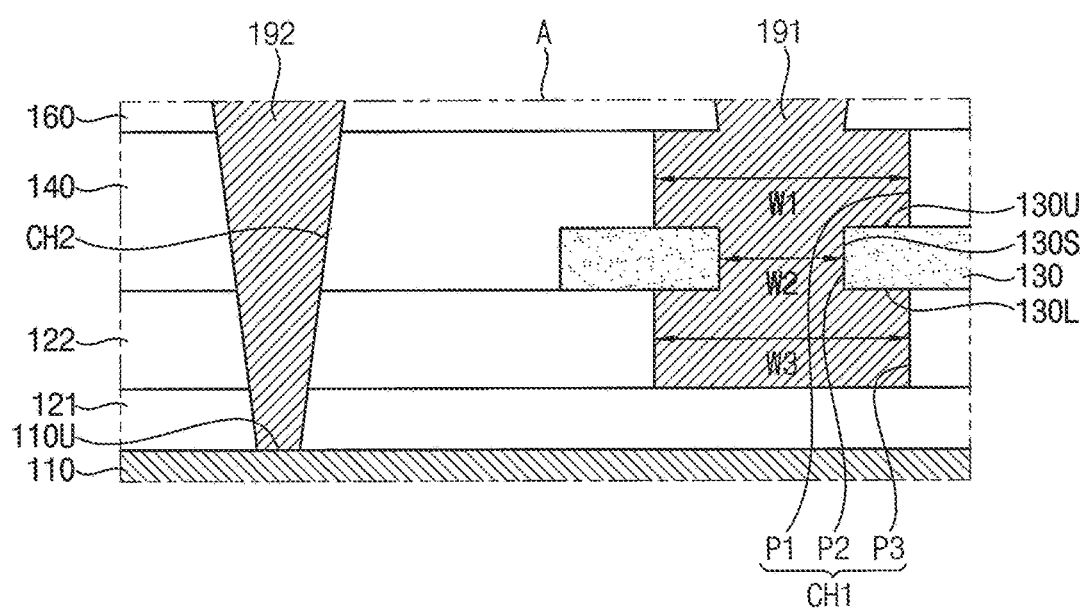
FIG. 2 is a cross-sectional view showing the region A of FIG. 1.

Referring to FIGS. 1 and 2, the display substrate according to one or more embodiments of the present disclosure may include a transistor TR, a capacitor CAP, a first electrode 191, and a second electrode 192 which are disposed on a substrate 100 (e.g., on a substrate with one or more intervening layers or components). The transistor TR may include a first gate electrode 110, an active layer 130, and a second gate electrode 150. The capacitor CAP may include a second gate electrode 150 and a capacitor electrode 170. In one or more embodiments, the transistor TR and the capacitor CAP include the same second gate electrode (e.g., the second gate electrode 150 functions as a lower electrode of the capacitor CAP and an upper gate electrode of the transistor TR).

The substrate 100 may be a transparent insulating substrate including glass, quartz, plastic, and/or the like. In one or more embodiments, the substrate 100 may include a first plastic layer, a first barrier layer disposed on the first plastic layer, a second plastic layer disposed on the first barrier layer, and/or a second barrier layer disposed on the second plastic layer. The first plastic layer and/or the second plastic layer may include an organic insulating material such as polyimide (PI). The first barrier layer and/or the second barrier layer may include an inorganic insulating material such as silicon oxide, silicon nitride, and/or amorphous silicon. For example, the first barrier layer may have a multilayer structure including an amorphous silicon layer and a silicon oxide layer disposed on the amorphous silicon layer, and the second barrier layer may have a single-layer structure including a silicon oxide layer.

The first gate electrode 110 may be disposed on the substrate 100. The first gate electrode 110 may block external light, impurities, and/or the like from being introduced into the active layer 130 through the substrate 100. In one or more embodiments, the first gate electrode 110 may be between the active layer 130 and the substrate 100. In addition, when a voltage is applied to the first gate electrode 110, the first gate electrode 110 may function as a lower gate electrode of the transistor TR. For example, a direct current voltage may be applied to the first gate electrode 110. In this case, a threshold voltage of the transistor TR may be adjusted. Accordingly, hysteresis characteristics of the transistor TR may be improved. The first gate electrode 110 may include a conductive material such as molybdenum (Mo) and/or copper (Cu).

A first gate insulating layer 120 may be disposed on the substrate 100 to cover the first gate electrode 110. The first gate insulating layer 120 may block impurities from being introduced through the substrate 100, and may provide a flat surface on the substrate 100. In addition, the first gate insulating layer 120 may insulate the active layer 130 from the first gate electrode 110. The first gate insulating layer 120 may include silicon nitride, silicon oxide, and/or the like.

In one or more embodiments, the first gate insulating layer 120 may include a first sub-insulating layer 121 and a second sub-insulating layer 122. The first sub-insulating layer 121 may be disposed on the substrate 100 to cover the first gate electrode 110. The second sub-insulating layer 122 may be disposed on the first sub-insulating layer 121.

In one or more embodiments, the first sub-insulating layer 121 may include silicon nitride, and the second sub-insulating layer 122 may include silicon oxide. A thickness of the second sub-insulating layer 122 may be greater than a thickness of the first sub-insulating layer 121. For example, the thickness of the second sub-insulating layer 122 may be about 3000 Å, and the thickness of the first sub-insulating layer 121 may be about 500 Å.

The active layer 130 may be disposed on the first gate insulating layer 120. The active layer 130 may overlap (e.g., in the thickness direction) the first gate electrode 110. In one or more embodiments, the active layer 130 may include polycrystalline silicon. The active layer 130 may include a source region, a drain region, and a channel region disposed between the source and drain regions. Each of the source and drain regions may be doped with P-type or N-type impurities or dopants.

A second gate insulating layer 140 may be disposed on the first gate insulating layer 120 to cover the active layer 130. The second gate insulating layer 140 may insulate the second gate electrode 150 from the active layer 130. In one or more embodiments, the second gate insulating layer 140 may include silicon oxide (e.g., $SiO_2$). A thickness of the second gate insulating layer 140 may be about 1200 Å.

The second gate electrode 150 may be disposed on the second gate insulating layer 140. The second gate electrode 150 may overlap (e.g., in the thickness direction) the channel region of the active layer 130. The first gate electrode 110 may overlap the second gate electrode 150 with the active layer 130 interposed therebetween. The second gate electrode 150 may function as an upper gate electrode of the transistor TR. Accordingly, the transistor TR may be formed as a transistor having a dual gate structure including the first gate electrode 110 as the lower gate electrode and the second gate electrode 150 as the upper gate electrode. In addition, the second gate electrode 150 may function as a lower electrode of the capacitor CAP. The second gate electrode 150 may include a conductive material such as molybdenum (Mo) and/or copper (Cu).

A first interlayer insulating layer 160 may be disposed on the second gate insulating layer 140 to cover the second gate electrode 150. The first interlayer insulating layer 160 may insulate the capacitor electrode 170 from the second gate electrode 150. In one or more embodiments, the first interlayer insulating layer 160 may include silicon nitride. A thickness of the first interlayer insulating layer 160 may be about 1370 Å.

The capacitor electrode 170 may be disposed on the first interlayer insulating layer 160. The capacitor electrode 170 may overlap (e.g., in the thickness direction) the second gate electrode 150. The capacitor electrode 170 may function as an upper electrode of the capacitor CAP. Accordingly, the capacitor CAP may be formed as a capacitor including the second gate electrode 150 as the lower electrode and the capacitor electrode 170 as the upper electrode. The capacitor electrode 170 may include a conductive material such as molybdenum (Mo) and/or copper (Cu).

A second interlayer insulating layer 180 may be disposed on the first interlayer insulating layer 160 to cover the capacitor electrode 170. The second interlayer insulating layer 180 may insulate the first electrode 191 and the second electrode 192 from the capacitor electrode 170. The second interlayer insulating layer 180 may include silicon nitride, silicon oxide, and/or the like. The first interlayer insulating layer 160 and the second interlayer insulating layer 180 may configure (or form) an interlayer insulating layer.

The first electrode 191 and the second electrode 192 may be disposed on the second interlayer insulating layer 180. The first electrode 191 may be connected (e.g., electrically connected) to the active layer 130, and the second electrode 192 may be connected (e.g., electrically connected) to the first gate electrode 110. For example, the first electrode 191 may be connected (e.g., electrically connected) to the source region or the drain region of the active layer 130. Each of the first electrode 191 and the second electrode 192 may include a conductive material such as aluminum (Al), titanium (Ti), and/or copper (Cu).

The first electrode 191 may contact the active layer 130 through a first contact hole CH1 formed through the second interlayer insulating layer 180, the first interlayer insulating layer 160, the second gate insulating layer 140, the active layer 130, and a portion of the first gate insulating layer 120. In more detail, the first electrode 191 may contact a top surface 130U, a side wall 130S, and a bottom surface 130L of the active layer 130 exposed by the first contact hole CH1.

In one or more embodiments, the first contact hole CH1 may be formed through the second interlayer insulating layer 180, the first interlayer insulating layer 160, the second gate insulating layer 140, the active layer 130, and the second sub-insulating layer 122 of the first gate insulating layer 120. In other words, the portion of the first gate insulating layer 120 through which the first contact hole CH1 is formed may be the second sub-insulating layer 122. In one or more embodiments, the first contact hole CH1 does not extend through the first sub-insulating layer 121.

The first contact hole CH1 may include a first portion P1 formed through the second gate insulating layer 140, a second portion P2 formed through the active layer 130, and a third portion P3 formed through the portion of the first gate insulating layer 120, that is, the second sub-insulating layer 122. The first portion P1 may expose the top surface 130U of the active layer 130, the second portion P2 may expose the side wall 130S of the active layer 130, and the third portion P3 may expose the bottom surface 130L of the active layer 130. In one or more embodiments, the first portion P1 may be a region between opposing ends of the second gate insulating layer 140, the second portion P2 may a region between opposing ends of the active layer 130, and the third portion P3 may be a region between opposing ends of the second sub-insulating layer 122. In one or more embodiments, the second portion P2 may be between the first portion P1 and the third portion P3. The second portion P2 may be adjacent to the first portion P1 and the third portion P3.

In one or more embodiments, a width W1 of the first portion P1 may be greater than a width W2 of the second portion P2, and a width W3 of the third portion P3 may be greater than the width W2 of the second portion P2. In other words, the width W2 of the second portion P2 may be smaller or less than the width W1 of the first portion P1, and the width W2 of the second portion P2 may be smaller or less than the width W3 of the third portion P3. In a process of forming the first contact hole CH1, the second gate insulating layer 140 and the second sub-insulating layer 122 of the first gate insulating layer 120, which include silicon oxide, are isotropically etched, and the active layer 130 including polycrystalline silicon is anisotropically etched, so that the width W1 of the first portion P1 and the width W3 of the third portion P3 may be greater than the width W2 of the second portion P2. Accordingly, a portion of the top surface 130U and a portion of the bottom surface 130L as well as the side wall 130S of the active layer 130 may be exposed, and the first electrode 191 may contact the top surface 130U, the side wall 130S, and the bottom surface 130L of the active layer 130 exposed by the first contact hole CH1.

The second electrode 192 may contact the first gate electrode 110 through a second contact hole CH2 formed through the second interlayer insulating layer 180, the first interlayer insulating layer 160, the second gate insulating layer 140, and the first gate insulating layer 120. In more detail, the second electrode 192 may contact the top surface 110U of the first gate electrode 110 exposed by the second contact hole CH2.

In a related art display substrate according to a comparative example, only a side wall of the active layer may be exposed by a first contact hole, and a first electrode may contact the side wall of the active layer exposed by a first contact hole. In this case, because the first electrode contacts only the side wall of the active layer, a contact resistance between the first electrode and the active layer may be increased. However, in the display substrate according to one or more embodiments of the present disclosure, the top surface 130U and the bottom surface 130L of the active layer 130 as well as the side wall 130S of the active layer 130 may be exposed by the first contact hole CH1, and the first electrode 191 may contact the top surface 130U, the side wall 130S, and the bottom surface 130L of the active layer 130 exposed by the first contact hole CH1. Because the first electrode 191 contacts the top surface 130U and the bottom surface 130L of the active layer 130 as well as the side wall 130S of the active layer 130, a contact resistance between the first electrode 191 and the active layer 130 may be decreased.

Hereinafter, a method of manufacturing a display substrate according to one or more embodiments of the present disclosure will be described with reference to FIGS. 1, 3, 4, 5, 6, and 7.

FIGS. 3, 4, 5, 6, and 7 are cross-sectional views showing a method of manufacturing a display substrate according to one or more embodiments of the present disclosure.

Figure 3:
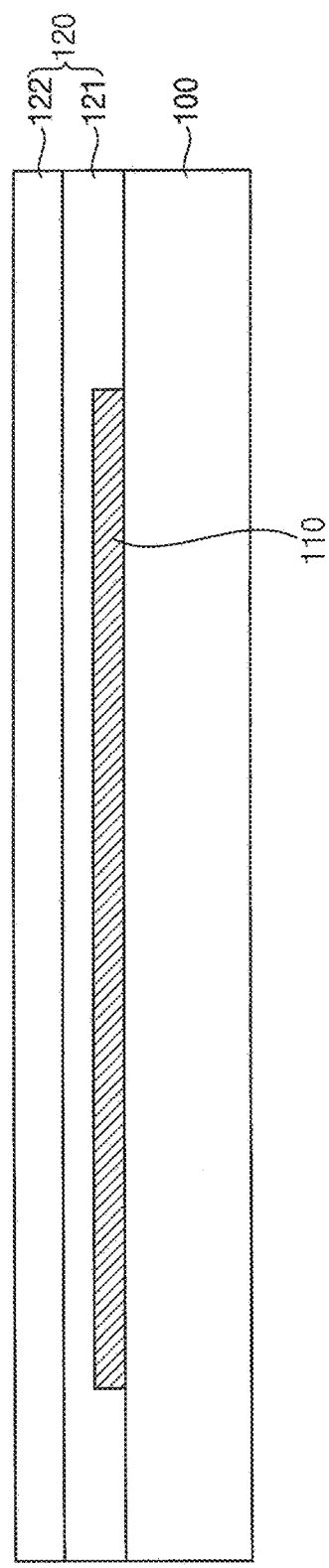
FIGS. 3, 4, 5, 6, and 7 are cross-sectional views showing a method of manufacturing a display substrate according to one or more embodiments of the present disclosure.

Referring to FIG. 3, the first gate electrode 110 may be formed on the substrate 100, and the first gate insulating layer 120 may be formed on the substrate 100 to cover the first gate electrode 110.

In one or more embodiments, the first gate electrode 110 may be formed on the substrate 100. For example, a conductive layer may be formed by depositing a conductive material such as molybdenum (Mo) and/or copper (Cu) on the substrate 100 by using physical vapor deposition such as sputtering, and the conductive layer may be etched to form the first gate electrode 110.

Next, the first gate insulating layer 120 (including the first sub-insulating layer 121 and the second sub-insulating layer 122) may be formed on the first gate electrode 110. For example, the first sub-insulating layer 121 may be formed by depositing silicon nitride on the first gate electrode 110 by using chemical vapor deposition such as plasma-enhanced chemical vapor deposition (PECVD), and the second sub-insulating layer 122 may be formed by depositing silicon oxide on the first sub-insulating layer 121 by using chemical vapor deposition such as PECVD.

Figure 4:
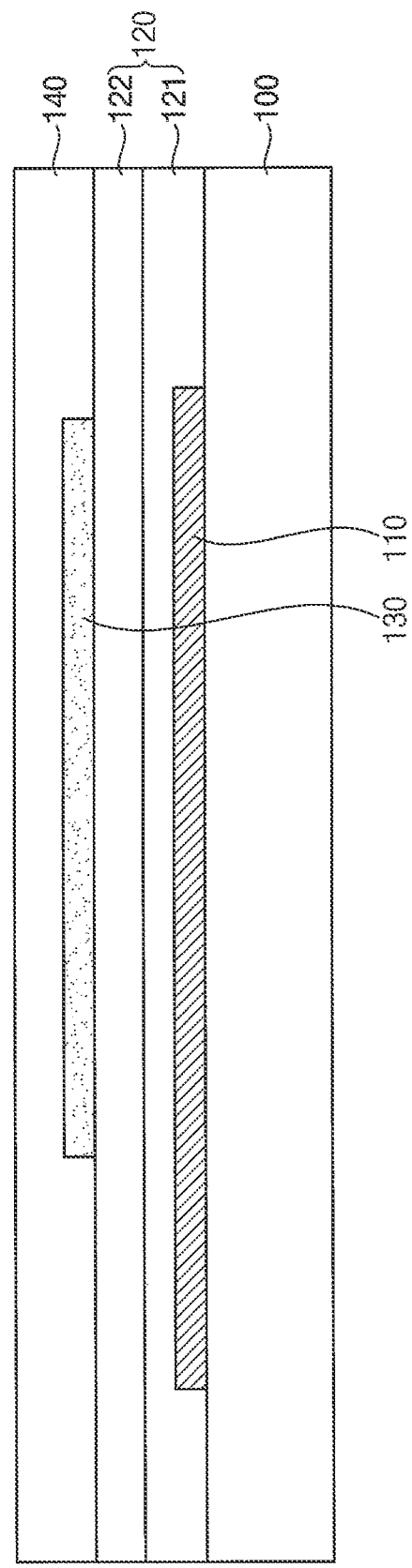

Referring to FIG. 4, the active layer 130 may be formed on the first gate insulating layer 120 (e.g., on the second sub-insulating layer 122), and the second gate insulating layer 140 may be formed on the first gate insulating layer 120 (e.g., on the second sub-insulating layer 122) to cover the active layer 130.

In one or more embodiments, the active layer 130 may be formed on the first gate insulating layer 120. For example, an amorphous silicon layer may be formed by depositing amorphous silicon on the first gate insulating layer 120 by using chemical vapor deposition such as PECVD, and the amorphous silicon layer may be crystallized by using an excimer laser or the like to form a polycrystalline silicon layer. In addition, the polycrystalline silicon layer may be etched to form the active layer 130.

Next, the second gate insulating layer 140 may be formed on the active layer 130. For example, the second gate insulating layer 140 may be formed by depositing silicon oxide on the active layer 130 by using chemical vapor deposition such as PECVD. In one or more embodiments, the second gate insulating layer 140 is formed on the active layer 130 in response to formation of the active layer 130.

Figure 5:
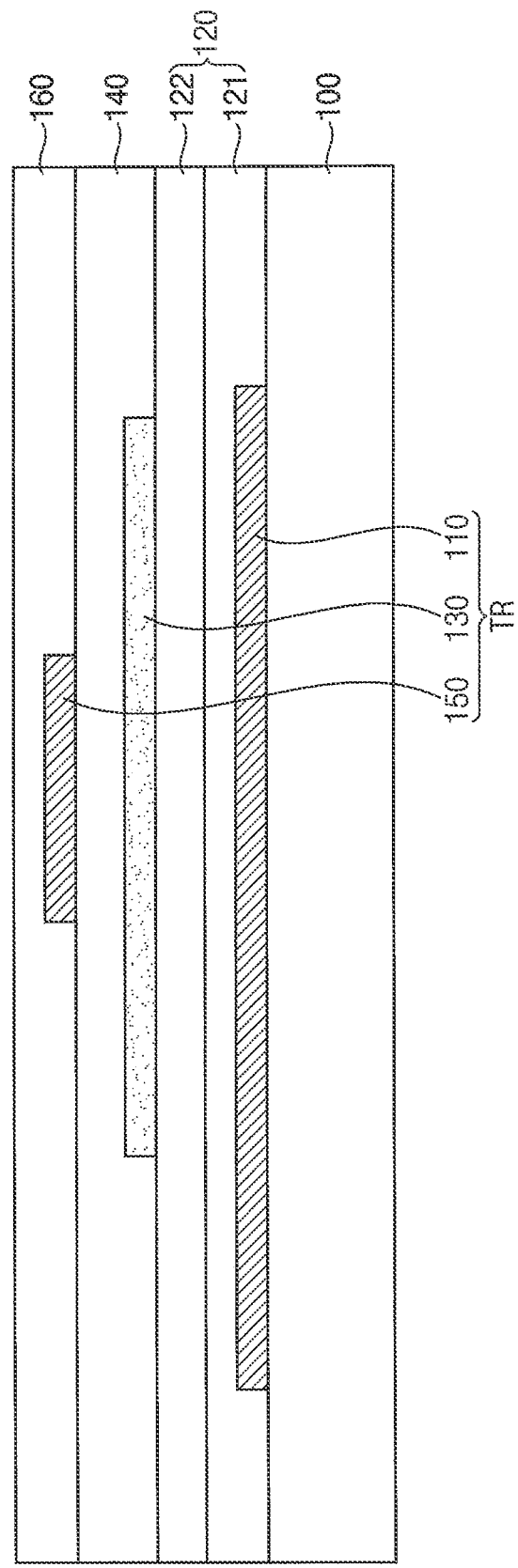

Referring to FIG. 5, the second gate electrode 150 may be formed on the second gate insulating layer 140, and the first interlayer insulating layer 160 may be formed on the second gate insulating layer 140 to cover the second gate electrode 150. In one or more embodiments, the first interlayer insulating layer 160 is formed on the second gate insulating layer 140 in response to formation of the second gate electrode 150.

In one or more embodiments, the second gate electrode 150 may be formed on the second gate insulating layer 140. For example, a conductive layer may be formed by depositing a conductive material such as molybdenum (Mo) and/or copper (Cu) on the second gate insulating layer 140 by using physical vapor deposition such as sputtering, and the conductive layer may be etched to form the second gate electrode 150. After forming the second gate electrode 150, P-type or N-type impurities or dopants may be injected into the active layer 130 by using the second gate electrode 150 as a mask.

Next, the first interlayer insulating layer 160 may be formed on the second gate electrode 150. For example, the first interlayer insulating layer 160 may be formed by depositing silicon nitride on the second gate electrode 150 by using chemical vapor deposition such as PECVD. In one or more embodiments, the first interlayer insulating layer 160 is formed on the second gate electrode 150 in response to injecting impurities into or doping the active layer 130.

Figure 6:
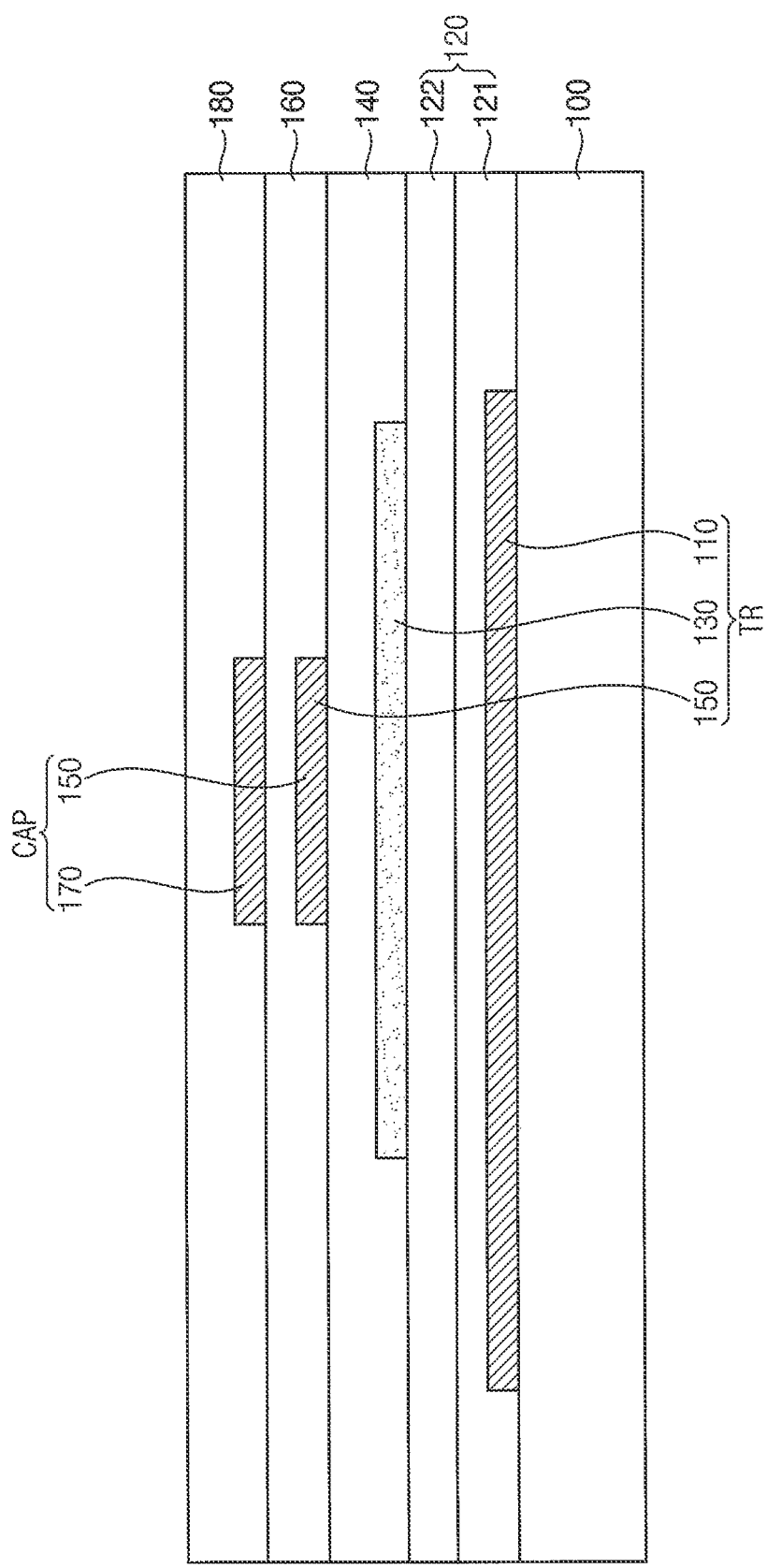

Referring to FIG. 6, the capacitor electrode 170 may be formed on the first interlayer insulating layer 160, and the second interlayer insulating layer 180 may be formed on the first interlayer insulating layer 160 to cover the capacitor electrode 170.

In one or more embodiments, the capacitor electrode 170 may be formed on the first interlayer insulating layer 160. For example, a conductive layer may be formed by depositing a conductive material such as molybdenum (Mo) and/or copper (Cu) on the first interlayer insulating layer 160 by using physical vapor deposition such as sputtering, and the conductive layer may be etched to form the capacitor electrode 170.

Next, the second interlayer insulating layer 180 may be formed on the capacitor electrode 170. For example, the second interlayer insulating layer 180 may be formed by depositing silicon nitride, silicon oxide, or the like on the capacitor electrode 170 by using chemical vapor deposition such as PECVD. In one or more embodiments, the second interlayer insulating layer 180 is formed on the capacitor electrode 170 in response to formation of the capacitor electrode 170.

Figure 7:
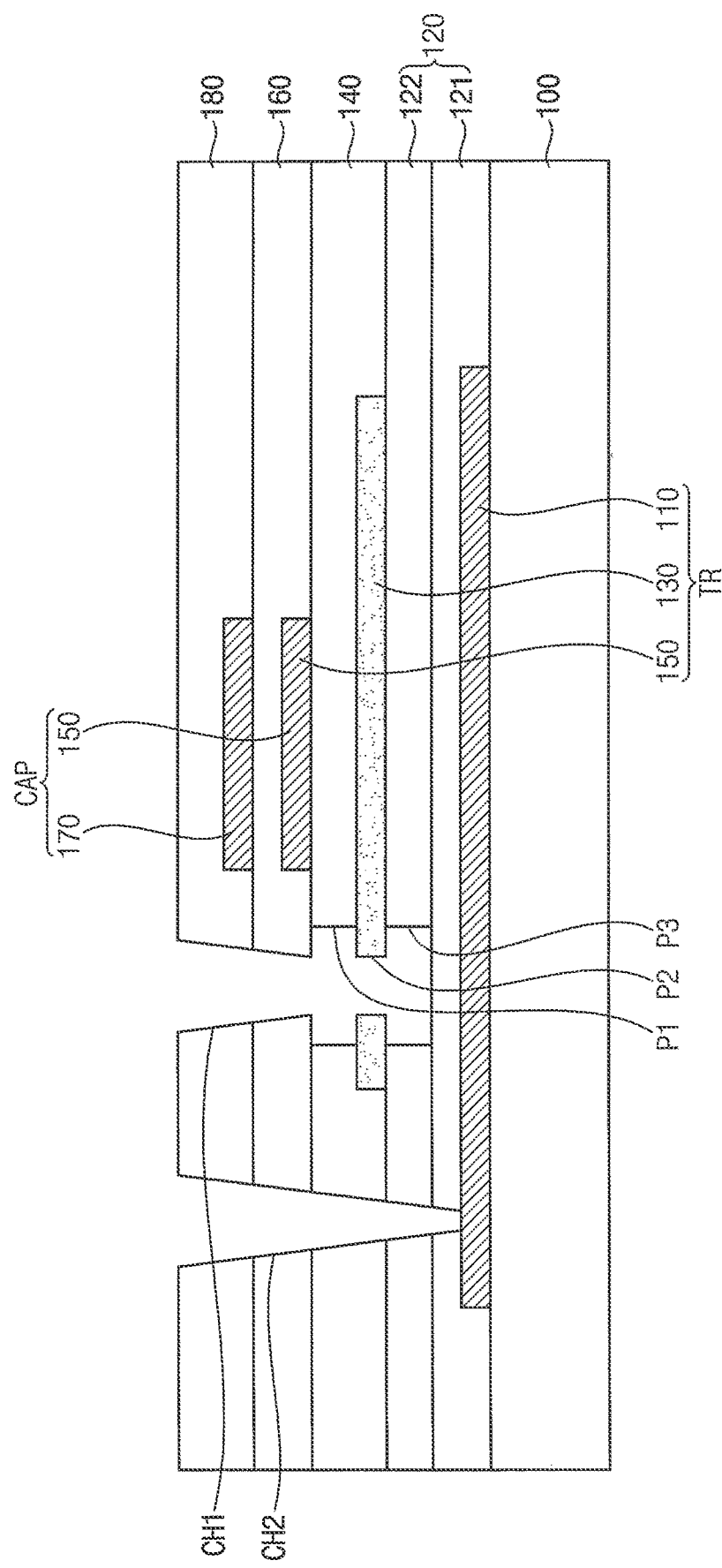

Referring to FIG. 7, the first contact hole CH1 and the second contact hole CH2 may be formed in the second interlayer insulating layer 180, the first interlayer insulating layer 160, the second gate insulating layer 140, and the first gate insulating layer 120.

The first contact hole CH1 may expose the active layer 130 through the second interlayer insulating layer 180, the first interlayer insulating layer 160, the second gate insulating layer 140, the active layer 130, and the portion of the first gate insulating layer 120. In more detail, the first contact hole CH1 may expose the top surface, the side wall, and the bottom surface of the active layer 130. In one or more embodiments, the portion of the first gate insulating layer 120 may be the second sub-insulating layer 122. In one or more embodiments, the first contact hole CH1 may extend through the second interlayer insulating layer 180, the first interlayer insulating layer 160, the second gate insulating layer 140, the active layer 130, and the portion of the first gate insulating layer 120 (e.g., the second sub-insulating layer 122). In one or more embodiments, the first contact hole CH1 may expose a bottom surface of the first interlayer insulating layer 160 that defines a gap between the bottom surface of the first interlayer insulating layer 160 and the top surface of the active layer 130. In one or more embodiments, the first contact hole CH1 may expose a top surface of the first gate insulating layer 120 (e.g., the first sub-insulating layer 121) that defines a gap between the top surface of the first gate insulating layer 120 (e.g., the first sub-insulating layer 121) and the bottom surface of the active layer 130.

The second contact hole CH2 may expose the first gate electrode 110 through the second interlayer insulating layer 180, the first interlayer insulating layer 160, the second gate insulating layer 140, and the first gate insulating layer 120. In more detail, the second contact hole CH2 may expose a top surface of the first gate electrode 110. In one or more embodiments, the second contact hole CH2 extends through second interlayer insulating layer 180, the first interlayer insulating layer 160, the second gate insulating layer 140, and into a portion of the first gate insulating layer 120 (e.g., through the second sub-insulating layer 122 and into a portion of the first sub-insulating layer 121). In one or more embodiments, the second contact hole CH2 extends a greater distance in the thickness direction than the first contact hole CH1.

The first contact hole CH1 and the second contact hole CH2 may be formed concurrently or at substantially the same time. For example, the first contact hole CH1 and the second contact hole CH2 may be formed at substantially the same time based on a photo process using a mask having light transmitting portions corresponding to the first contact hole CH1 and the second contact hole CH2, respectively.

In one or more embodiments, the first contact hole CH1 and the second contact hole CH2 may be formed by an etching scheme (e.g., a dry etching scheme) using one etching gas (e.g., only one etching gas). In other words, by using the one etching gas, the first contact hole CH1 may be formed by etching the second interlayer insulating layer 180, the first interlayer insulating layer 160, the second gate insulating layer 140, the active layer 130, and the portion of the first gate insulating layer 120, and the second contact hole CH2 may be formed by etching the second interlayer insulating layer 180, the first interlayer insulating layer 160, the second gate insulating layer 140, and the first gate insulating layer 120.

In one or more embodiments, the first contact hole CH1 and the second contact hole CH2 may be formed by using an etching gas obtained by mixing a first gas including at least one of $CHF_3$, $C_4F_8$, $C_2HF_5$, $CH_2F_2$, and/or $CF_4$ with a second gas including at least one of $SF_6$ and/or $NF_3$. The first gas may be used to etch polycrystalline silicon. An etching rate of the second gas with respect to silicon oxide may be greater than an etching rate of the second gas with respect to silicon nitride.

In the process of forming the first contact hole CH1, the etching rate of the second gas with respect to silicon oxide is greater than the etching rate of the second gas with respect to silicon nitride, so that the second gate insulating layer 140 and the second sub-insulating layer 122 of the first gate insulating layer 120, which include silicon oxide, may be isotropically etched. Accordingly, each of the first portion P1 of the first contact hole CH1 formed by etching the second gate insulating layer 140 and the third portion P3 of first contact hole CH1 formed by etching the second sub-insulating layer 122 of the first gate insulating layer 120 may have a relatively large width (e.g., a width larger or greater than the second portion P2 of the first contact hole CH1), and the first portion P1 and the third portion P3 of the first contact hole CH1 may expose the top surface and the bottom surface of the active layer 130, respectively.

In addition, the first gas may etch polycrystalline silicon in the process of forming the first contact hole CH1, so that the active layer 130 including polycrystalline silicon may be anisotropically etched. Accordingly, the second portion P2 of the first contact hole CH1 formed by etching the active layer 130 may expose the side wall of the active layer 130.

Referring to FIG. 1, the first electrode 191 may fill (e.g., be configured to fill) the first contact hole CH1 and the second electrode 192 may fill (e.g., be configured to fill) the second contact hole CH2. The first electrode 191 and the second electrode 192 may be formed on the second interlayer insulating layer 180. For example, a conductive layer configured to fill the first contact hole CH1 and the second contact hole CH2 may be formed by depositing a conductive material such as aluminum (Al), titanium (Ti), and/or copper (Cu) on the second interlayer insulating layer 180 by using physical vapor deposition such as sputtering, and the conductive layer may be etched to form the first electrode 191 and the second electrode 192. The first electrode 191 may fill the first contact hole CH1 to contact the top surface, the side wall, and the bottom surface of the active layer 130 exposed by the first contact hole CH1. The second electrode 192 may fill the second contact hole CH2 to contact the top surface of the first gate electrode 110 exposed by the second contact hole CH2.

In a related art method of manufacturing a display substrate according to a comparative example, two photo processes may be used to form a first contact hole which exposes a top surface of an active layer and a second contact hole which exposes a top surface of a first gate electrode. In this case, an additional photo process for forming the second contact hole may be used, thereby increasing a manufacturing time and a manufacturing cost for the display substrate. However, in the method of manufacturing the display substrate according to one or more embodiments of the present disclosure, one photo process may be used to form the first contact hole CH1 which exposes the top surface, the side wall, and the bottom surface of the active layer 130 and the second contact hole CH2 which exposes the top surface of the first gate electrode 110. Because the second contact hole CH2 is formed together with the first contact hole CH1 without an additional photo process, a manufacturing time and a manufacturing cost for the display substrate may be decreased (e.g., decreased compared to the comparative example).

Hereinafter, a method of manufacturing a display substrate according to another embodiment of the present disclosure will be described with reference to FIGS. 8, 9, and 10.

Figure 8:
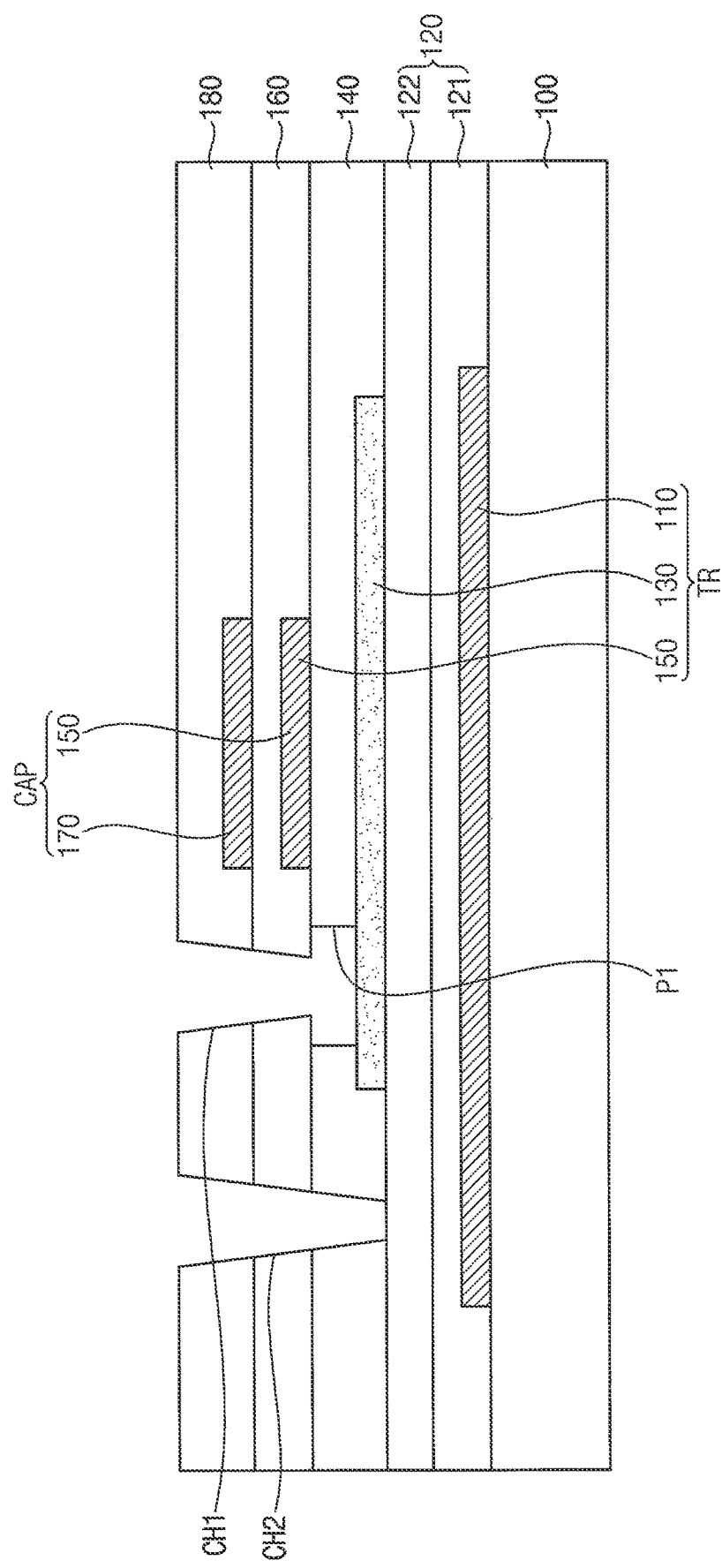
FIGS. 8, 9, and 10 are cross-sectional views showing a method of manufacturing a display substrate according to another embodiment of the present disclosure.
Figure 9:
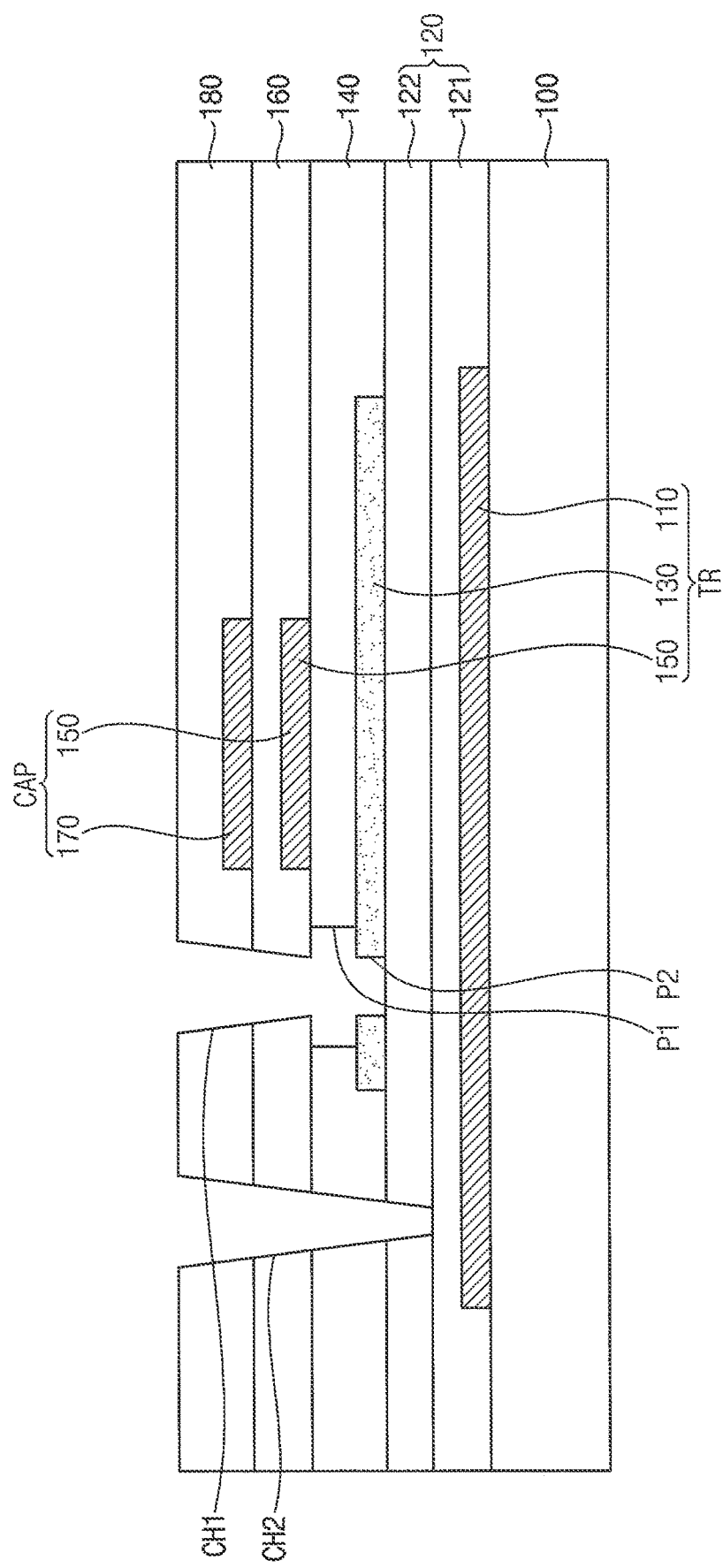
Figure 10:
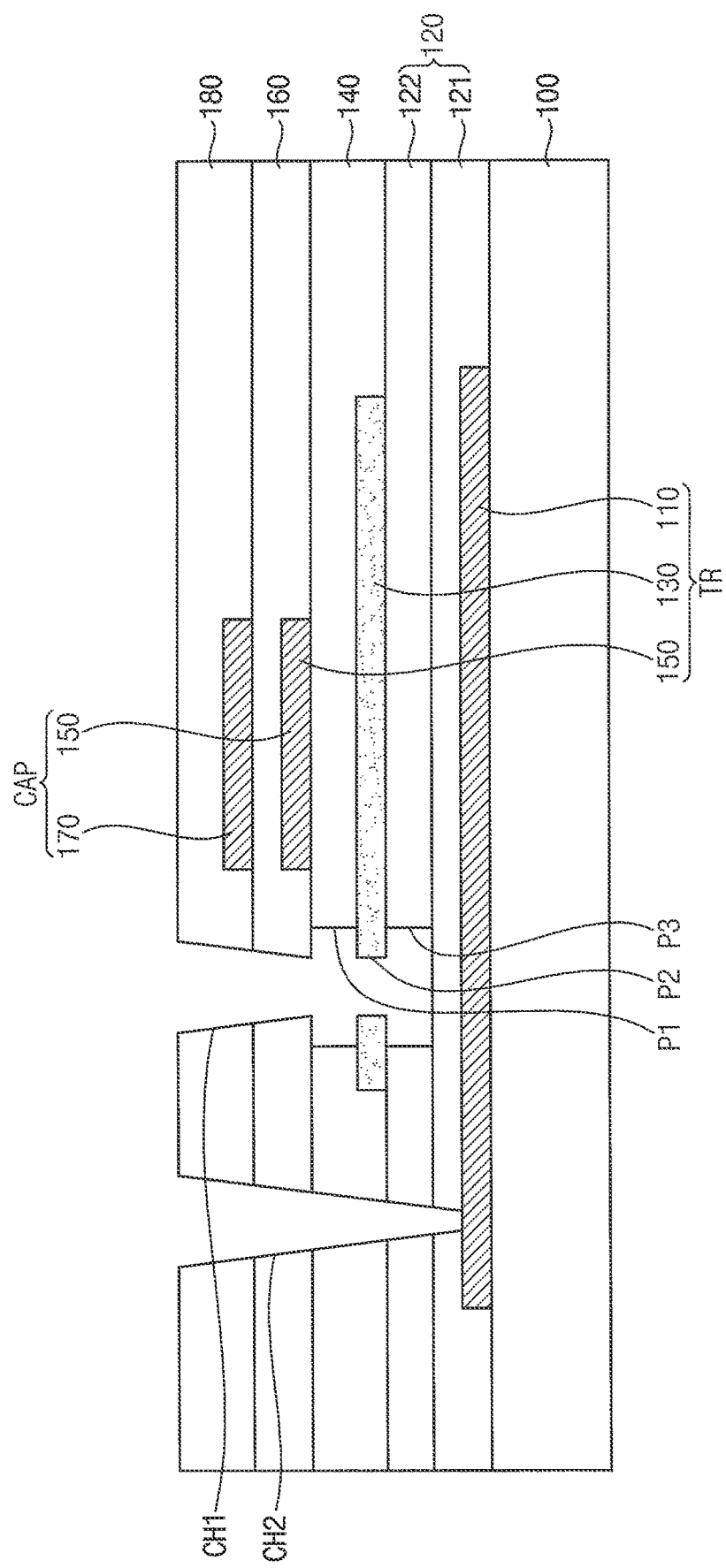

FIGS. 8, 9, and 10 are cross-sectional views showing a method of manufacturing a display substrate according to another embodiment of the present disclosure. The method of manufacturing the display substrate, which will be described with reference to FIGS. 8, 9, and 10, may be substantially identical or similar to the method of manufacturing the display substrate described with reference to FIGS. 1, and 3, 4, 5, 6, and 7 except for forming of the first contact hole CH1 and the second contact hole CH2. Accordingly, in the method of manufacturing the display substrate, which will be described with reference to FIGS. 8, 9, and 10, descriptions of components substantially identical or similar to the components of the method of manufacturing the display substrate described with reference to FIGS. 1, 3, 4, 5, 6, and 7 will be not be provided again.

Referring to FIGS. 8, 9, and 10, the first contact hole CH1 and the second contact hole CH2 may be formed in the second interlayer insulating layer 180, the first interlayer insulating layer 160, the second gate insulating layer 140, and the first gate insulating layer 120.

In one or more embodiments, the first contact hole CH1 and the second contact hole CH2 may be formed by using two or more different etching materials. In other words, by using the two or more different etching materials, the first contact hole CH1 may be formed by etching the second interlayer insulating layer 180, the first interlayer insulating layer 160, the second gate insulating layer 140, the active layer 130, and the portion of the first gate insulating layer 120, and the second contact hole CH2 may be formed by etching the second interlayer insulating layer 180, the first interlayer insulating layer 160, the second gate insulating layer 140, and the first gate insulating layer 120.

In one or more embodiments, as shown in FIG. 8, the first portion P1 of the first contact hole CH1 which exposes the top surface of the active layer 130 may be formed by etching the second interlayer insulating layer 180, the first interlayer insulating layer 160, and the second gate insulating layer 140. In one or more embodiments, a bottom surface of the first interlayer insulating layer 160 is exposed by the first contact hole CH1. A first etching material may be used to form the first portion P1 of the first contact hole CH1. While the first portion P1 of the first contact hole CH1 is formed, the second contact hole CH2 may be partially formed by etching the second interlayer insulating layer 180, the first interlayer insulating layer 160, and the second gate insulating layer 140.

In one or more embodiments, the first etching material may include an etching gas obtained by mixing a first gas including at least one of $CHF_3$, $C_4F_8$, $C_2HF_5$, $CH_2F_2$, and/or $CF_4$ with a second gas including at least one of $SF_6$ and/or $NF_3$, or an etchant including a buffered oxide etchant (BOE). An etching rate of the first etching material with respect to silicon oxide may be greater than an etching rate of the first etching material with respect to silicon nitride. Because the etching rate of the first etching material with respect to silicon oxide is greater than the etching rate of the first etching material with respect to silicon nitride, the second gate insulating layer 140 including silicon oxide may be isotropically etched. Accordingly, the first portion P1 of the first contact hole CH1 formed by etching the second gate insulating layer 140 may have a relatively large width (e.g., a width larger or greater than the second portion P2 of the first contact hole CH1).

Next, as shown in FIG. 9, the second portion P2 of the first contact hole CH1 which exposes the side wall of the active layer 130 may be formed by etching the active layer 130. A second etching material may be used to form the second portion P2 of the first contact hole CH1. While the second portion P2 of the first contact hole CH1 is formed, the second contact hole CH2 may be partially formed by etching the portion of the first gate insulating layer 120 (e.g., the second sub-insulating layer 122).

In one or more embodiments, the second etching material may include an etching gas obtained by mixing a first gas including at least one of $CHF_3$, $C_4F_8$, $C_2HF_5$, $CH_2F_2$, and/or $CF_4$ with a second gas including at least one of $SF_6$ and/or $NF_3$, and the second etching material may be different from the first etching material. The second etching material may be used to etch polycrystalline silicon. Because the second etching material may etch polycrystalline silicon, the active layer 130 including polycrystalline silicon may be anisotropically etched. Accordingly, the second portion P2 of the first contact hole CH1 formed by etching the active layer 130 may expose the side wall of the active layer 130 with a relatively small width (e.g., a width smaller or less than the first portion of the first contact hole CH1 and/or the third portion of the first contact hole CH1), and the first portion P1 of the first contact hole CH1 may expose the top surface of the active layer 130.

Next, as shown in FIG. 10, the third portion P3 of the first contact hole CH1 which exposes the bottom surface of the active layer 130 may be formed by etching the portion of the first gate insulating layer 120 (e.g., the second sub-insulating layer 122). A third etching material may be used to form the third portion P3 of the first contact hole CH1. While the third portion P3 of the first contact hole CH1 is formed, the second contact hole CH2 may be formed by etching a portion of the first gate insulating layer 120 (e.g., the first sub-insulating layer 121).

In one or more embodiments, the third etching material may be different from the second etching material. In one or more embodiments, the third etching material may be substantially the same as the first etching material. An etching rate of the third etching material with respect to silicon oxide may be greater than an etching rate of the third etching material with respect to silicon nitride. Because the etching rate of the third etching material with respect to silicon oxide is greater than the etching rate of the third etching material with respect to silicon nitride, the second sub-insulating layer 122 of the first gate insulating layer 120 including silicon oxide may be isotropically etched. Accordingly, the third portion P3 of the first contact hole CH1 formed by etching the second sub-insulating layer 122 of the first gate insulation layer 120 may expose the bottom surface of the active layer 130 with a relatively large width (e.g., a width larger or greater than the second portion P2 of the first contact hole CH1).

Hereinafter, a display device according to one or more embodiments of the present disclosure will be described with reference to FIGS. 11, 12, and 13.

Figure 11:
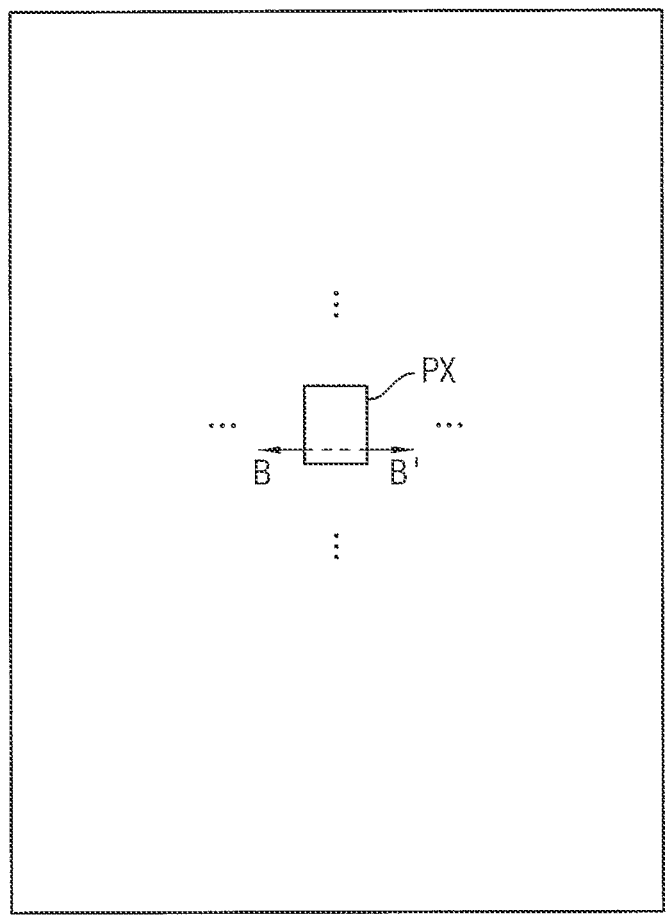
FIG. 11 is a plan view showing a display device according to one or more embodiments of the present disclosure.

FIG. 11 is a plan view showing a display device according to one or more embodiments of the present disclosure.

Referring to FIG. 11, the display device according to one or more embodiments may include a plurality of pixels PX. Each of the pixels PX may emit light, and the display device may display an image formed by using the light emitted from each of the pixels PX. The pixels PX may be arranged substantially in a matrix form along a row direction and a column direction.

Figure 12:
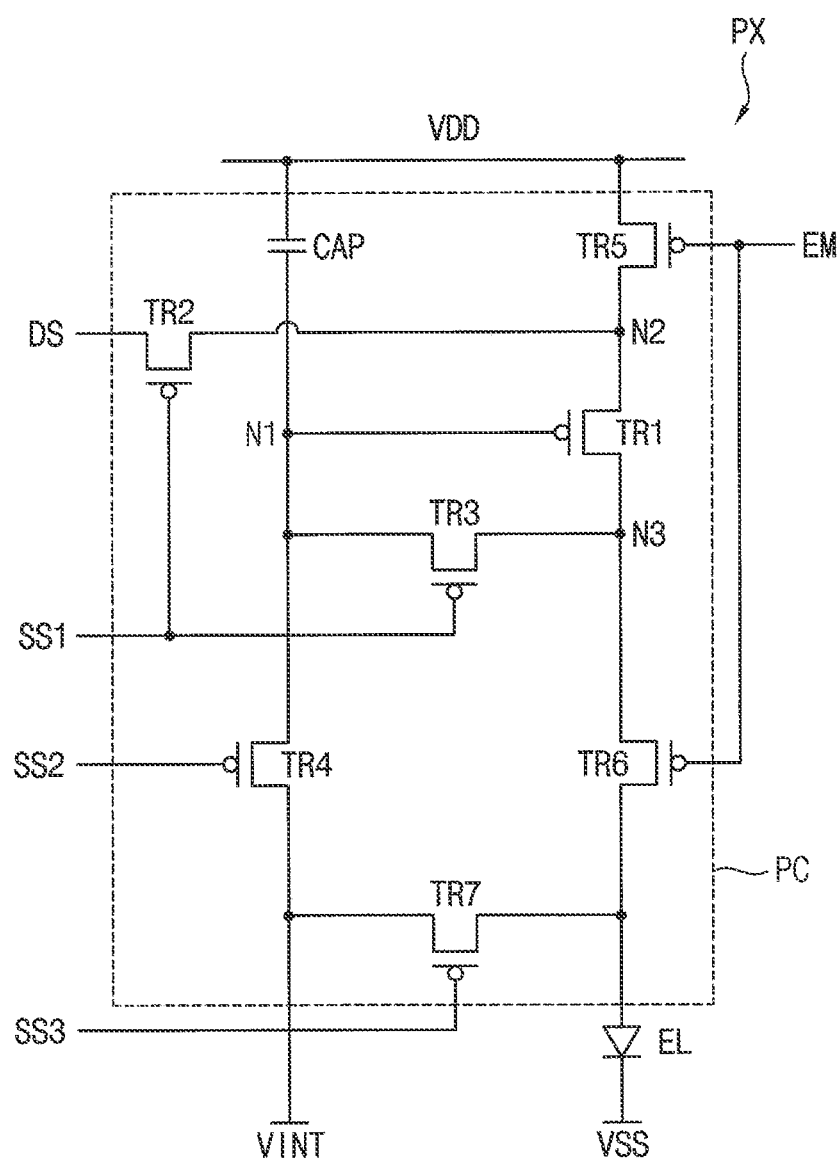
FIG. 12 is a circuit diagram showing one example of a pixel of FIG. 11.

FIG. 12 is a circuit diagram showing one example of a pixel PX of FIG. 11.

Referring to FIG. 12, the pixel PX may include a pixel circuit PC and a light emitting element EL connected to the pixel circuit PC. The pixel circuit PC may provide a driving current to the light emitting element EL. The light emitting element EL may emit light based on the driving current provided from the pixel circuit PC. The pixel circuit PC may include at least one transistor and at least one capacitor to generate the driving current.

In one or more embodiments, the pixel circuit PC may include a first transistor TR1, a second transistor TR2, a third transistor TR3, a fourth transistor TR4, a fifth transistor TR5, a sixth transistor TR6, a seventh transistor TR7, and a capacitor CAP, but the present disclosure is not limited thereto. In another embodiment, the pixel circuit PC may include two to five or seven or more transistors and/or two or more capacitors.

A gate electrode of the first transistor TR1 may be connected to a first node N1. A source electrode of the first transistor TR1 may be connected to a second node N2, and a drain electrode of the first transistor TR1 may be connected to a third node N3. The first transistor TR1 may generate a driving current based on a voltage between the gate electrode and the source electrode.

A first scan signal SS1 may be applied to a gate electrode of the second transistor TR2. A data signal DS may be applied to a source electrode of the second transistor TR2, and a drain electrode of the second transistor TR2 may be connected to the second node N2. The second transistor TR2 may transmit the data signal DS to the second node N2 based on the first scan signal SS1.

The first scan signal SS1 may be applied to a gate electrode of the third transistor TR3. A source electrode of the third transistor TR3 may be connected to the first node N1, and a drain electrode of the third transistor TR3 may be connected to the third node N3. The third transistor TR3 may compensate for a threshold voltage of the first transistor TR1 by connecting the gate electrode and the drain electrode of the first transistor TR1 based on the first scan signal SS1.

A second scan signal SS2 may be applied to a gate electrode of the fourth transistor TR4. In one or more embodiments, when the pixel PX is included in an Nth pixel row, the second scan signal SS2 may be a first scan signal applied to an (N−1)th pixel row. An initialization voltage VINT may be applied to a source electrode of the fourth transistor TR4, and a drain electrode of the fourth transistor TR4 may be connected to the first node N1. The fourth transistor TR4 may initialize the gate electrode of the first transistor TR1 by transmitting the initialization voltage VINT to the first node N1 based on the second scan signal SS2.

A light emission control signal EM may be applied to a gate electrode of the fifth transistor TR5. A first power supply voltage VDD may be applied to a source electrode of the fifth transistor TR5, and a drain electrode of the fifth transistor TR5 may be connected to the second node N2.

The light emission control signal EM may be applied to a gate electrode of the sixth transistor TR6. A source electrode of the sixth transistor TR6 may be connected to the third node N3, and a drain electrode of the sixth transistor TR6 may be connected to the light emitting element EL. The fifth transistor TR5 and the sixth transistor TR6 may transmit the driving current generated by the first transistor TR1 to the light emitting element EL based on the light emission control signal EM.

A third scan signal SS3 may be applied to a gate electrode of the seventh transistor TR7. In one or more embodiments, when the pixel PX is included in the Nth pixel row, the third scan signal SS3 may be a first scan signal applied to an (N+1)th pixel row. The initialization voltage VINT may be applied to a source electrode of the seventh transistor TR7, and a drain electrode of the seventh transistor TR7 may be connected to the light emitting element EL. The seventh transistor TR7 may initialize the light emitting element EL by transmitting the initialization voltage VINT to the light emitting element EL based on the third scan signal SS3.

The first power supply voltage VDD may be applied to a first electrode of the capacitor CAP, and a second electrode of the capacitor CAP may be connected to the first node N1. The capacitor CAP may maintain the voltage between the gate electrode and the source electrode of the first transistor TR1 even when the second transistor TR2 is turned off, so that the light emitting element EL may emit light.

A first electrode of the light emitting element EL may be connected to the pixel circuit PC, and a second power supply voltage VSS may be applied to a second electrode of the light emitting element EL. In one or more embodiments, the second power supply voltage VSS may be less than the first power supply voltage VDD. The light emitting element EL may emit the light based on the driving current transmitted from the pixel circuit PC.

Figure 13:
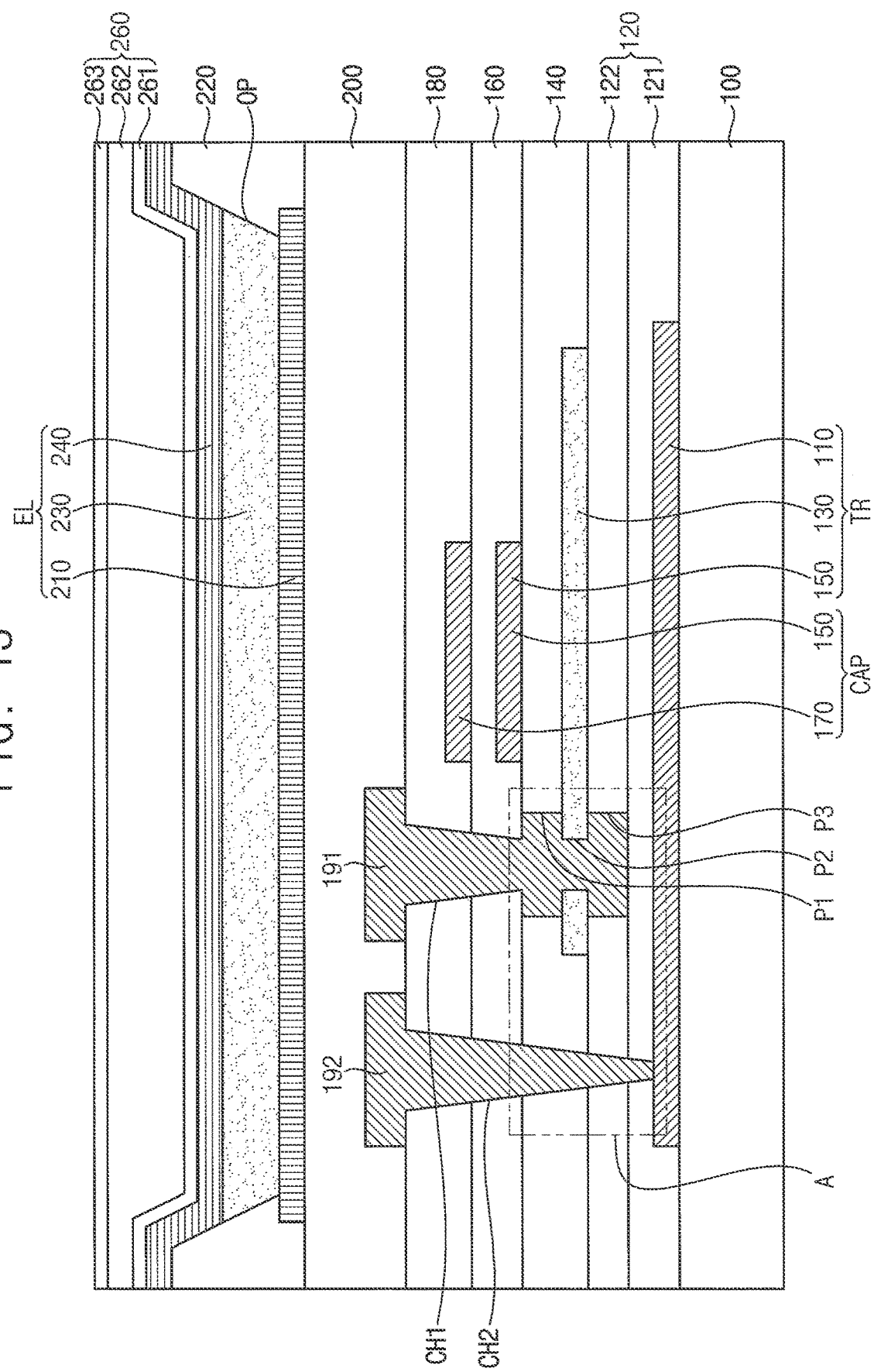
FIG. 13 is a cross-sectional view taken along the line B-B' of FIG. 11.

FIG. 13 is a cross-sectional view taken along the line B-B' of FIG. 11.

Referring to FIG. 13, the display device according to one or more embodiments of the present disclosure may include a transistor TR, a capacitor CAP, a first electrode 191, a second electrode 192, a light emitting element EL, and an encapsulation layer 260 which are disposed on a substrate 100. The display device which will be described with reference to FIG. 13 may include the display substrate described with reference to FIGS. 1 and 2. Accordingly, in the display device which will be described with reference to FIG. 13, descriptions of components substantially identical or similar to the components of the display substrate described with reference to FIGS. 1 and 2 will be not be provided again.

In one or more embodiments, the transistor TR may be one of the first transistor TR1, the second transistor TR2, the third transistor TR3, the fourth transistor TR4, the fifth transistor TR5, the sixth transistor TR6, and the seventh transistor TR7 of FIG. 12.

A planarization layer 200 may be disposed on the second interlayer insulating layer 180 to cover the first electrode 191 and the second electrode 192. The planarization layer 200 may provide a flat surface on the first electrode 191 and the second electrode 192. The planarization layer 200 may include an organic insulating material such as polyimide (PI).

The light emitting element EL including a pixel electrode 210, a counter electrode 240 overlapping (e.g., in the thickness direction) the pixel electrode 210, and a light emitting layer 230 disposed between the pixel electrode 210 and the counter electrode 240 may be disposed on the planarization layer 200.

The pixel electrode 210 may be disposed on the planarization layer 200. The pixel electrode 210 may include a conductive material such as a metal, an alloy, and/or transparent conductive oxide. For example, the pixel electrode 210 may include silver (Ag), indium tin oxide (ITO), and/or the like.

A pixel defining layer 220 may be disposed on the planarization layer 200 to cover the pixel electrode 210. The pixel defining layer 220 may have a pixel opening OP which exposes at least a portion of the pixel electrode 210. In one or more embodiments, the pixel opening OP may expose a central portion of the pixel electrode 210, and the pixel defining layer 220 may cover a peripheral portion of the pixel electrode 210. The pixel defining layer 220 may include an organic insulating material such as polyimide (PI).

The light emitting layer 230 may be disposed on the pixel electrode 210. The light emitting layer 230 may be disposed on the pixel electrode 210 exposed by the pixel opening OP. The light emitting layer 230 may include at least one of an organic light emitting material and/or a quantum dot.

In one or more embodiments, the organic light emitting material may include a low-molecular-weight organic compound or a high-molecular-weight organic compound. For example, the low-molecular-weight organic compound may include copper phthalocyanine, N,N'-diphenylbenzidine, tris-(8-hydroxyquinoline)aluminum, and the like, and the high-molecular-weight organic compound may include poly (3,4-ethylenedioxythiophene), polyaniline, poly-phenylenevinylene, polyfluorene, and the like.

In one or more embodiments, the quantum dot may include a core including a Group II-VI compound, a Group III-V compound, a Group IV-VI compound, a Group IV element, and/or a Group IV compound. In one or more embodiments, the quantum dot may have a core-shell structure including a core and a shell surrounding the core. The shell may serve as a protective layer for preventing or substantially preventing the core from being chemically denatured to maintain semiconductor characteristics, and may serve as a charging layer for imparting electrophoretic characteristics to the quantum dot.

The counter electrode 240 may be disposed on the light emitting layer 230. In one or more embodiments, the counter electrode 240 may also be disposed on the pixel defining layer 220. The counter electrode 240 may include a conductive material such as a metal, an alloy, and transparent conductive oxide. For example, the counter electrode 240 may include aluminum (Al), platinum (Pt), silver (Ag), magnesium (Mg), gold (Au), chromium (Cr), tungsten (W), titanium (Ti), and the like.

The encapsulation layer 260 may be disposed on the counter electrode 240. The encapsulation layer 260 may cover the light emitting element EL to protect the light emitting element EL from impurities such as oxygen and moisture. The encapsulation layer 260 may include at least one inorganic encapsulation layer and at least one organic encapsulation layer. In one or more embodiments, the encapsulation layer 260 may include a first inorganic encapsulation layer 261 disposed on the counter electrode 240, an organic encapsulation layer 262 disposed on the first inorganic encapsulation layer 261, and a second inorganic encapsulation layer 263 disposed on the organic encapsulation layer 262. The inorganic encapsulation layer may include silicon nitride, silicon oxynitride, and/or the like, and the organic encapsulation layer may include an epoxy-based resin, an acryl-based resin, a polyimide-based resin, and/or the like.

The display substrate according to the embodiments may be applied to a display device included in a computer, a notebook, a mobile phone, a smartphone, a smart pad, a PMP, a PDA, an MP3 player, and/or the like.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

As used herein, the phrases such as "a plan view" may refer to a view from top or from a direction normal to the surface of the display substrate.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Although the display substrate, the method of manufacturing the display substrate, and the display device according to the embodiments have been described with reference to the drawings, the illustrated embodiments are examples, and may be modified and changed by a person having ordinary knowledge in the relevant technical field without departing from the technical spirit described in the following claims, and equivalents thereof.

What is claimed is:

1. A method of manufacturing a display substrate, the method comprising:
    forming a first gate electrode on a substrate;
    forming a first gate insulating layer on the substrate to cover the first gate electrode;
    forming an active layer on the first gate insulating layer, the active layer comprising a source region, a channel region, and a drain region;
    forming a second gate insulating layer on the first gate insulating layer to cover the active layer;
    forming a second gate electrode on the second gate insulating layer;
    forming an interlayer insulating layer on the second gate insulating layer to cover the second gate electrode;
    forming a first contact hole through the interlayer insulating layer, the second gate insulating layer, the active layer, and a portion of the first gate insulating layer to expose a top surface, a side wall, and a bottom surface of the active layer;
    forming a second contact hole spaced from the active layer and through the interlayer insulating layer, the second gate insulating layer, and the first gate insulating layer to expose the first gate electrode; and
    forming a first electrode to fill the first contact hole and a second electrode to fill the second contact hole on the interlayer insulating layer,
    wherein the first contact hole and the second contact hole are concurrently formed.

2. The method of claim 1, wherein the first contact hole and the second contact hole are formed by a dry etching scheme utilizing one etching gas.

3. The method of claim 2, wherein the first contact hole and the second contact hole are formed by the etching gas obtained by mixing a first gas comprising at least one of $CHF_3$, $C_4F_8$, $C_2HF_5$, $CH_2F_2$, or $CF_4$ with a second gas comprising at least one of $SF_6$ or $NF_3$.

4. The method of claim 1, wherein the first contact hole and the second contact hole are formed by utilizing at least two different etching materials.

5. The method of claim 4, wherein the forming of the first contact hole comprises:
    forming a first portion of the first contact hole which exposes the top surface of the active layer by etching the second gate insulating layer;
    forming a second portion of the first contact hole which exposes the side wall of the active layer by etching the active layer; and
    forming a third portion of the first contact hole which exposes the bottom surface of the active layer by etching the portion of the first gate insulating layer, and
    wherein a first etching material for forming the first portion is different from a second etching material for forming the second portion.

6. The method of claim 5, wherein the first etching material comprises an etching gas obtained by mixing a first gas comprising at least one of $CHF_3$, $C_4F_8$, $C_2HF_5$, $CH_2F_2$, or $CF_4$ with a second gas comprising at least one of $SF_6$ or $NF_3$, or an etchant comprising a buffered oxide etchant (BOE).

7. The method of claim 5, wherein the second etching material comprises an etching gas obtained by mixing a first gas comprising at least one of $CHF_3$, $C_4F_8$, $C_2HF_5$, $CH_2F_2$, or $CF_4$ with a second gas comprising at least one of $SF_6$ or $NF_3$.

8. The method of claim 5, wherein a third etching material for forming the third portion is different from the second etching material.

9. The method of claim 8, wherein the third etching material is the same as first etching material.

10. A method of manufacturing a display substrate, the method comprising:
    forming a first electrode on a substrate;
    forming a first insulating layer on the substrate to cover the first electrode;
    forming an active layer on the first insulating layer, the active layer comprising a source region, a channel region, and a drain region;
    forming a second insulating layer on the first insulating layer to cover the active layer;
    forming a second electrode on the second insulating layer;
    forming an interlayer insulating layer on the second insulating layer to cover the second electrode;
    forming a first contact hole through the interlayer insulating layer, the second insulating layer, the active layer, and a portion of the first insulating layer to expose a top surface, a side wall, and a bottom surface of the active layer;
    forming a second contact hole spaced from the active layer and through the interlayer insulating layer, the second insulating layer, and the first insulating layer to expose the first electrode; and
    forming a third electrode in the first contact hole and a fourth electrode in the second contact hole,
    wherein the first contact hole and the second contact hole are concurrently formed.

11. The method of claim 10, wherein the first contact hole and the second contact hole are formed by a dry etching scheme utilizing one etching gas.

12. The method of claim 11, wherein the first contact hole and the second contact hole are formed by the etching gas obtained by mixing a first gas comprising at least one of $CHF_3$, $C_4F_8$, $C_2HF_5$, $CH_2F_2$, or $CF_4$ with a second gas comprising at least one of $SF_6$ or $NF_3$.

13. The method of claim 10, wherein the first contact hole and the second contact hole are formed by utilizing at least two different etching materials.

14. The method of claim 13, wherein the forming of the first contact hole comprises:
forming a first portion of the first contact hole which exposes the top surface of the active layer by etching the second insulating layer;
forming a second portion of the first contact hole which exposes the side wall of the active layer by etching the active layer; and
forming a third portion of the first contact hole which exposes the bottom surface of the active layer by etching the portion of the first insulating layer, and
wherein a first etching material for forming the first portion is different from a second etching material for forming the second portion.

15. The method of claim 14, wherein the first etching material comprises an etching gas obtained by mixing a first gas comprising at least one of $CHF_3$, $C_4F_8$, $C_2HF_5$, $CH_2F_2$, or $CF_4$ with a second gas comprising at least one of $SF_6$ or $NF_3$, or an etchant comprising a buffered oxide etchant (BOE).

16. The method of claim 14, wherein the second etching material comprises an etching gas obtained by mixing a first gas comprising at least one of $CHF_3$, $C_4F_8$, $C_2HF_5$, $CH_2F_2$, or $CF_4$ with a second gas comprising at least one of $SF_6$ or $NF_3$.

17. The method of claim 14, wherein a third etching material for forming the third portion is different from the second etching material.

18. The method of claim 17, wherein the third etching material is the same as the first etching material.

* * * * *